United States Patent [19]

Boux

[11] 4,206,355
[45] Jun. 3, 1980

[54] SYSTEM FOR MONITORING THE POSITION INTENSITY UNIFORMITY AND DIRECTIVITY OF A BEAM OF IONIZING RADIATION

[75] Inventor: René' Boux, Paris, France
[73] Assignee: C.G.R.-Mev, Paris, France
[21] Appl. No.: 964,139
[22] Filed: Nov. 28, 1978

Related U.S. Application Data

[63] Continuation of Ser. No. 835,361, Sep. 21, 1977, abandoned, which is a continuation of Ser. No. 655,433, Feb. 4, 1976, abandoned.

[30] Foreign Application Priority Data

Feb. 7, 1975 [FR] France .................................. 75 03798

[51] Int. Cl.² ............................................. G01T 1/18
[52] U.S. Cl. ................................. 250/385; 250/374
[58] Field of Search ............... 250/385, 384, 357, 381, 250/374, 354, 395

[56] References Cited

U.S. PATENT DOCUMENTS

| | | | |
|---|---|---|---|
| 2,566,684 | 9/1951 | Tobias | 250/385 |
| 2,825,816 | 3/1958 | Rogers | 250/385 |
| 3,254,220 | 5/1966 | Madex | 250/385 |
| 3,808,441 | 4/1974 | Boux | 250/385 |
| 3,836,780 | 9/1974 | Amqvist et al. | 250/385 |
| 3,845,310 | 10/1974 | Perraudin | 250/385 |
| 3,898,466 | 8/1975 | Kawashima | 250/385 |
| 3,942,012 | 3/1976 | Boux | 250/385 |

*Primary Examiner*—Bruce C. Anderson
*Attorney, Agent, or Firm*—Karl F. Ross

[57] ABSTRACT

A monitoring system transparent to ionizing radiation, designed for measuring the position, intensity, uniformity and directivity of a radiation beam, comprises two or three superimposed ionization chambers respectively provided with respective disk electrodes. One electrode is of smaller area than the other electrode or electrodes, the latter being substantially equal to the cross-sectional area of the radiation beam. Circuits for processing the signals furnished by the different electrodes are associated with comparators and with a safety system which readjusts the beam or deactivates the radiation source in the event that certain "threshold" values are exceeded, indicating a deviation of the beam from a centered position.

9 Claims, 10 Drawing Figures

SYSTEM FOR MONITORING THE POSITION INTENSITY UNIFORMITY AND DIRECTIVITY OF A BEAM OF IONIZING RADIATION

CROSS-REFERENCE TO RELATED APPLICATIONS

This is a continuation of my copending and now abandoned application Ser. No. 835,361 filed 21 Sept. 1977 as a continuation of my prior application Ser. No. 655,433 filed 4 Feb. 1976, also abandoned.

BACKGROUND AND OBJECT OF THE INVENTION

The present invention relates to a monitoring system for determining deviations of a beam of ionizing radiation from a predetermined axis, comprising a plurality of coaxially superposed ionization chambers of the kind described in my copending U.S. patent application Ser. No. 434,912 filed 21 Jan. 1974, now U.S. Pat. No. 3,942,012. The object of this invention is to provide an improved assembly of ion-collecting electrodes in these ionization chambers, yielding comparable results with a simpler structure and simpler processing circuits.

SUMMARY OF THE INVENTION

In accordance with my present improvement, a monitoring system of the type disclosed in my above-identified prior patent comprises a radiation detector with a plurality of disk-shaped electrodes of different diameters in respective ionization chambers centered on an axis generally aligned with that of the beam, namely a smaller electrode in one ionization chamber and one or two larger electrodes in as many other ionization chambers. The smaller electrode has a diameter significantly less than that of the beam whereas the larger electrode or electrodes have diameters substantially equaling the beam diameter.

In order to take the difference in the sze of the several electrodes into account, the circuitry of my system designed to evaluate the relative magnitudes of the currents induced in these electrodes by the impinging beam includes a voltage-comparison network with input connections modifying the relative magnitudes of voltages proportional to these induced currents by a factor corresponding to the ratio of the surface areas of the electrodes, e.g. a voltage divider of suitable step-down ratio. Thus, the voltages arriving at the inputs of the comparison network are equal upon full illumination of all the electrodes by a homogenous beam.

According to another feature of my invention, the smaller electrode is electrically integral while the larger electrode or electrodes are divided into at least one pair of identical sectors electrically insulated from one another. In a three-electrode radiation detector, the two larger ones may be split into halves along mutually perpendicular diametral lines.

BRIEF DESCRIPTION OF THE DRAWING

The above and other features of my invention will now be described in detail with reference to the accompanying drawing in which.

SPECIFIC DESCRIPTION

Figure 1:
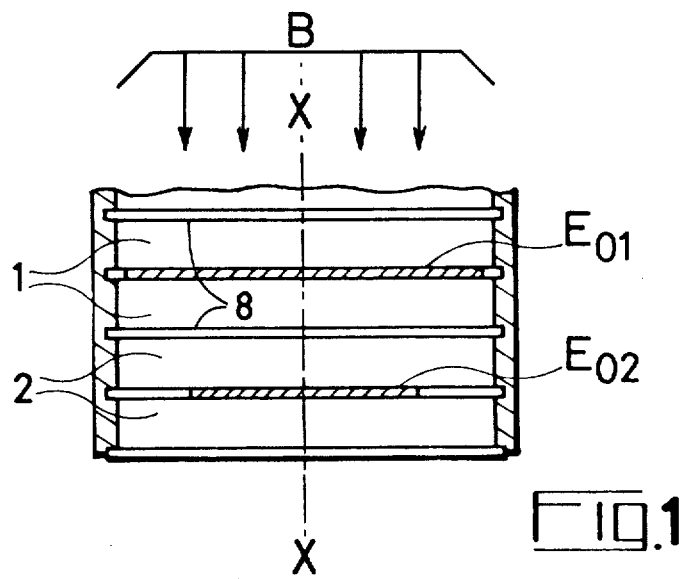
FIG. 1 is a fragmentary cross-sectional view of a radiation detector according to my invention having two ionization chambers.
Figure 2:
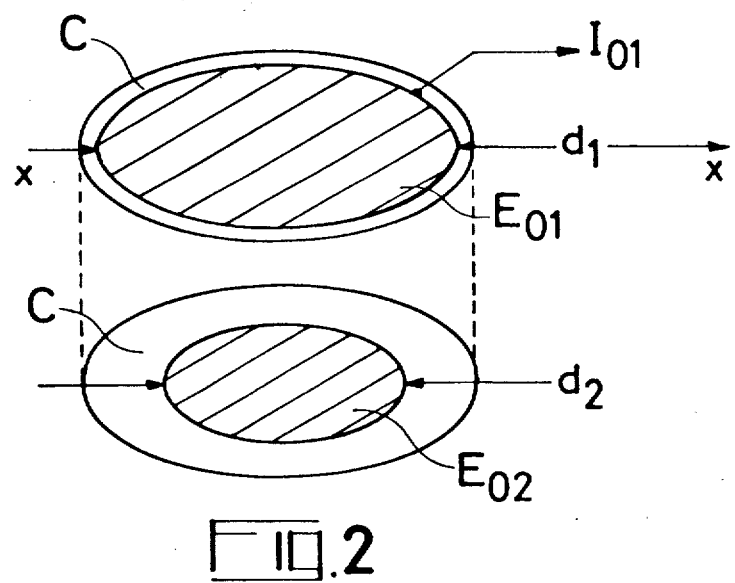
FIG. 2 is a schematic perspective view of two electrodes present in the ionization chambers of the radiation detector shown in FIG. 1.

FIG. 1 illustrates two ionization chambers 1 and 2 forming part of a radiation detector employed in a monitoring system in accordance with the present invention. These ionization chambers respectively contain two circular electrodes $E_{01}$ and $E_{02}$ constituted, as FIG. 2 schematically illustrates, by a frame C carrying a sheet of polyethylene terephthalate known as "MYLAR", for example, upon which there has been deposited, by vaporization under vacuum, a thin metallic film which is transparent to an axially incident ionizing beam B. The electrode $E_{01}$ has a diameter $d_1$ substantially equal to the diameter of the ionizing beam whereas the electrode $E_{02}$ has a diameter $d_2$ smaller than $d_1$. Their areas, respectively designated $S_{01}$ and $S_{02}$, thus satisfying the relationship:

$$S_{01} > S_{02}$$

In operation, the ionizing fluxes $\Phi_1$ and $\Phi_2$ respectively traversing the electrodes $E_{01}$ and $E_{02}$ are proportional to the currents $I_{01}$ and $I_{02}$ picked up by the electrodes $E_{01}$ and $E_{02}$. If the flux is uniform, then the equation:

$$\Phi_1 = (S_{01}/S_{02})\Phi_2 \tag{1}$$

corresponding to:

$$I_{01} = (S_{01}/S_{02})I_{02} \tag{2}$$

is satisfied.

It is to be noted that the electrodes located within these ionization chambers, separated by upper and lower metallized radiation-transparent walls 8, are suitably biased by substantially identical voltages which are negative with respect to these walls.

Figure 3:
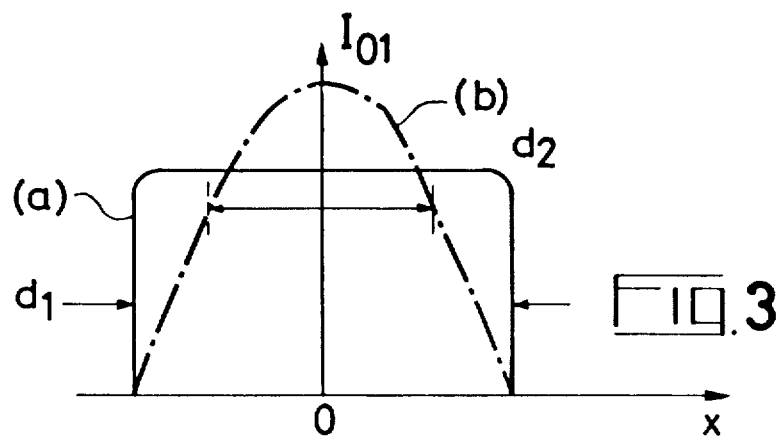
FIG. 3 illustrates two modes of distribution of the radiation intensity along a diametral line of these electrodes.

In FIG. 3, graph (a) represents the variation in the current $I_{01}$ and therefore in the flux $\Phi_{01}$, along a diametral line x—x (FIG. 2) of the electrode $E_{01}$, for a uniform and properly centered radiation beam; graph (b) illustrates the variation in the current $I_{01}$ through electrode $E_{01}$ when the radiation beam is nonuniform (in the considered case the beam is denser at its center than at its periphery). The currents $I_{01}$ and $I_{02}$ are then no longer proportional to the areas $S_{01}$ and $S_{02}$ of the electrodes $E_{01}$ and $E_{02}$, and equation (2) becomes an inequality $$I_{01} < (S_{01}/S_{02})I_{02} \tag{3}$$

Figure 4:
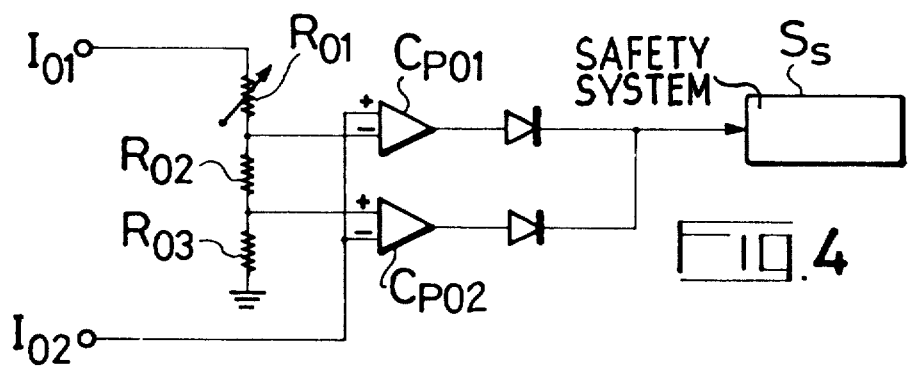
FIG. 4 schematically illustrates a comparator circuit associated with these electrodes.

A circuit (FIG. 4) comprising a voltage divider $R_{01}$, $R_{02}$, $R_{03}$ and two comparators $C_{P01}$ and $C_{P02}$ enables the voltages $V_{01}$ and $V_{02}$ corresponding to the currents $I_{01}$ and $I_{02}$, picked up at the electrodes $E_{01}$ and $E_{02}$, to be compared so that an associated safety system $S_s$ is triggered if:

$$V_{01} - S_{01}/S_{02} V_{02} > V_{threshold}, \quad (4)$$

$V_{threshold}$ being a threshold voltage of given value which depends upon the operating parameters or the characteristics of the irradiation device.

The ionization chambers 1, 2, which make it possible to determine the intensity, uniformity and directivity of the radiation beam, can be associated with another ionization chamber (not shown in FIG. 1) equipped for example with probes or comprising a conventional split electrode enabling the centering of the beam to be monitored.

Figure 5:
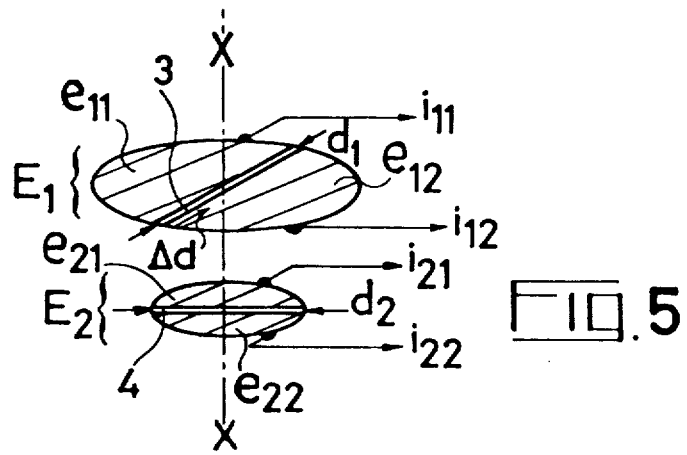
FIGS. 5, 6 and 7 are schematic perspective views illustrating three other embodiments of my present invention.

In FIG. 5 I have shown a device in accordance with the invention including two ionization chambers respectively equipped with two circular split electrodes $E_1$ and $E_2$. Two insulating strips 3 and 4 (formed of "MYLAR" without metallization) diametrally split the electrode $E_1$ into two elements $e_{11}$ and $e_{12}$, and the electrode $E_2$ into two other elements $e_{21}$ and $e_{22}$, these insulating strips 3 and 4 being perpendicular to one another. The electrode $E_1$ has an area $S_1$ substantially equal to the cross-sectional area of the ionizing beam, while the electrode $E_2$ has a smaller area $S_2$.

In operation, the elements $e_{11}$, $e_{12}$ and $e_{21}$, $e_{22}$ of the electrodes $E_1$ and $E_2$ respectively pick up currents $i_{11}$, $i_{12}$ and $i_{21}$, $i_{22}$. The ionizing radiation fluxes $\Phi_1$ and $\Phi_2$ respectively traversing the electrodes $E_1$ and $E_2$ are proportional to the currents $I_1 = i_{11} + i_{12}$ and $I_2 = i_{21} + i_{22}$, respectively picked up by the electrodes $E_1$ and $E_2$. If the flux is uniform, then the equation:

$$\Phi_1 = (S_1/S_2)\Phi_2 \quad (1')$$

corresponding to:

$$I_1 = (S_1/S_2)I_2 \quad (2')$$

is satisfied.

In operation, if we consider the most unfavorable case of a nonuniform radiation beam having an eccentricity $\Delta d$ with respect to the centerline of the insulating strip 3 of the electrode $E_1$, so that:

$$\Delta d \leq (d_2 - d_1)/2, \quad (5)$$

$d_1$ and $d_2$ being the respective diameters of the electrodes $E_1$ and $E_2$, then a comparison of the induced currents $I_1$ and $I_2$ yields the following relationships:

$$I_1 < (S_1/S_2)I_2 \quad (6)$$

$$i_{11} = i_{12} \quad (7)$$

$$i_{21} > i_{22} \quad (8)$$

The inequalities (6) and (8) then give rise to the operation of an alarm or safety system which stops the incident radiation.

In the case of a uniform beam which is eccentric, the conditions:

$$i_{11} = i_{12} \quad (9)$$

$$i_{21} = i_{22} \quad (10)$$

$$I_1 < (S_1/S_2)I_2 \quad (11)$$

may exist if the beam center lies along strip 3 offset from the chamber axis x—x. The inequality (11) causes the safety system to halt the emission of radiation at the beam source.

However, it should be pointed out that a centered, nonuniform beam produces at the outputs of the monitoring circuits relationships identical with formulas (9), (10), (11). As in the former case, the inequality (11) causes operation of the safety system and consequent halting of emission of the radiation beam. In the embodiment which has just been described, the reliability of operation of the device is therefore assured, but no indication is given to the defect which has developed in the radiation beam.

Such an indication is provided by two other embodiments (FIGS. 6 and 7) of my invention in which only the larger electrode or electrodes are divided into sectors.

Figure 6:
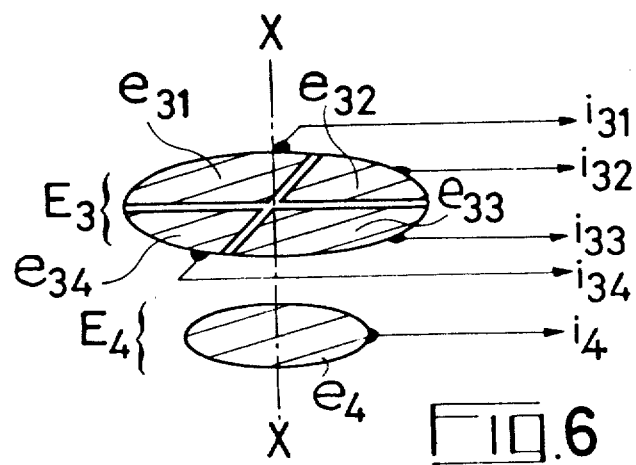

FIG. 6 schematically illustrates two electrodes $E_3$ and $E_4$ designed to be utilized in a system in accordance with the invention.

The electrode $E_3$ comprises four elements $e_{31}$, $e_{32}$, $e_{33}$ and $e_{34}$ and the electrode $E_4$ comprises a single element $e_4$.

In operation, measurement of the current $I_3 = i_{31} + i_{32} + i_{33} + i_{34}$ makes it possible to monitor the flux $\Phi$, that is to say the radiation dose which is proportional to the current $I_3$, this flux $\Phi$ likewise being monitored by the second ionization chamber furnishing a current $I_4 = S_4/S_3 I_3$. Moreover:

the beam is centered if $$i_{31} = i_{32} = i_{33} = i_{34}; \quad (12)$$

uniformity of the beam is satisfactory if $$I_3 = k(S_3/S_4)I_4, \quad (13)$$

k being a coefficient close to 1, taking account of the safety standards which are imposed.

Figure 7:
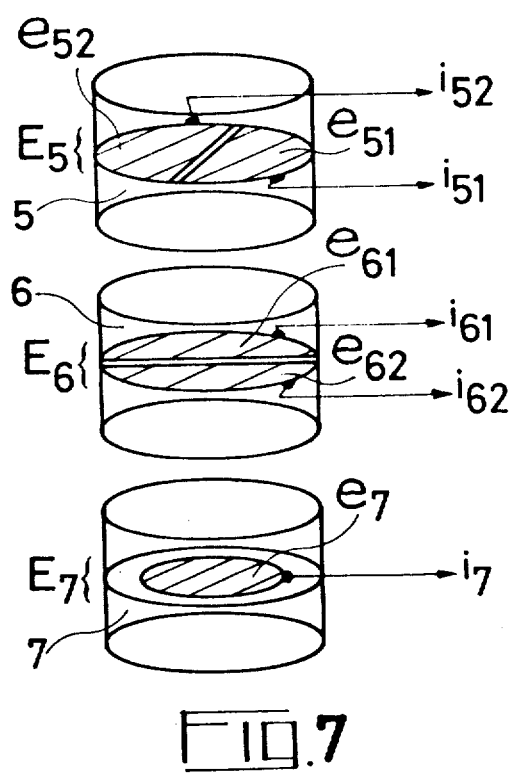

If the incident radiation is a scanning beam, monitoring of the centering of the beam can be achieved by associating with the ionization chamber, equipped for example with the electrode $E_3$ which has four elements $e_{31}, e_{32}, e_{33}, e_{34}$, a centering device of the kind described in commonly owned U.S. patent application Ser. No. 583,290. This type of centering device may also be associated with two electrodes such as $E_1$ and $E_2$, each have two elements, or better still with two electrodes $E_5$ and $E_6$ of a monitoring device in accordance with the present invenion as depicted in FIG. 7. This embodiment comprises three ionization chambers 5, 6 and 7. The electrodes $E_5$ and $E_6$ substantially have the same diameter as the radiation beam and comprise each two sectoral elements $e_{51}$, $e_{52}$ and $e_{61}$, $e_{62}$, respectively. A third electrode $E_7$, of smaller diameter, has only a single element $e_7$.

The elements $e_{51}$, $e_{52}$ of the electrode $E_5$, the elements $e_{61}$, $e_{62}$ of the electrode $E_6$ and the element $e_7$ of the electrode $E_7$ respectively pick up currents $i_{51}$ and $i_{52}$, $i_{61}$ and $i_{62}$, and $i_7$.

In the case of a nonuniform beam, this nonuniformity being due, for example, to the absence of a correcting filter or to some defect in the beam-scan function, the relationships:

$$i_7 > k(i_{51} + i_{52}) \tag{13}$$

and $$i_7 > k(i_{61} + i_{62}) \tag{14}$$

exist. These inequalities (13) and (14) trigger a safety system which interrupts the operation of the radiation source or readjusts the ionization beam.

Figure 8:
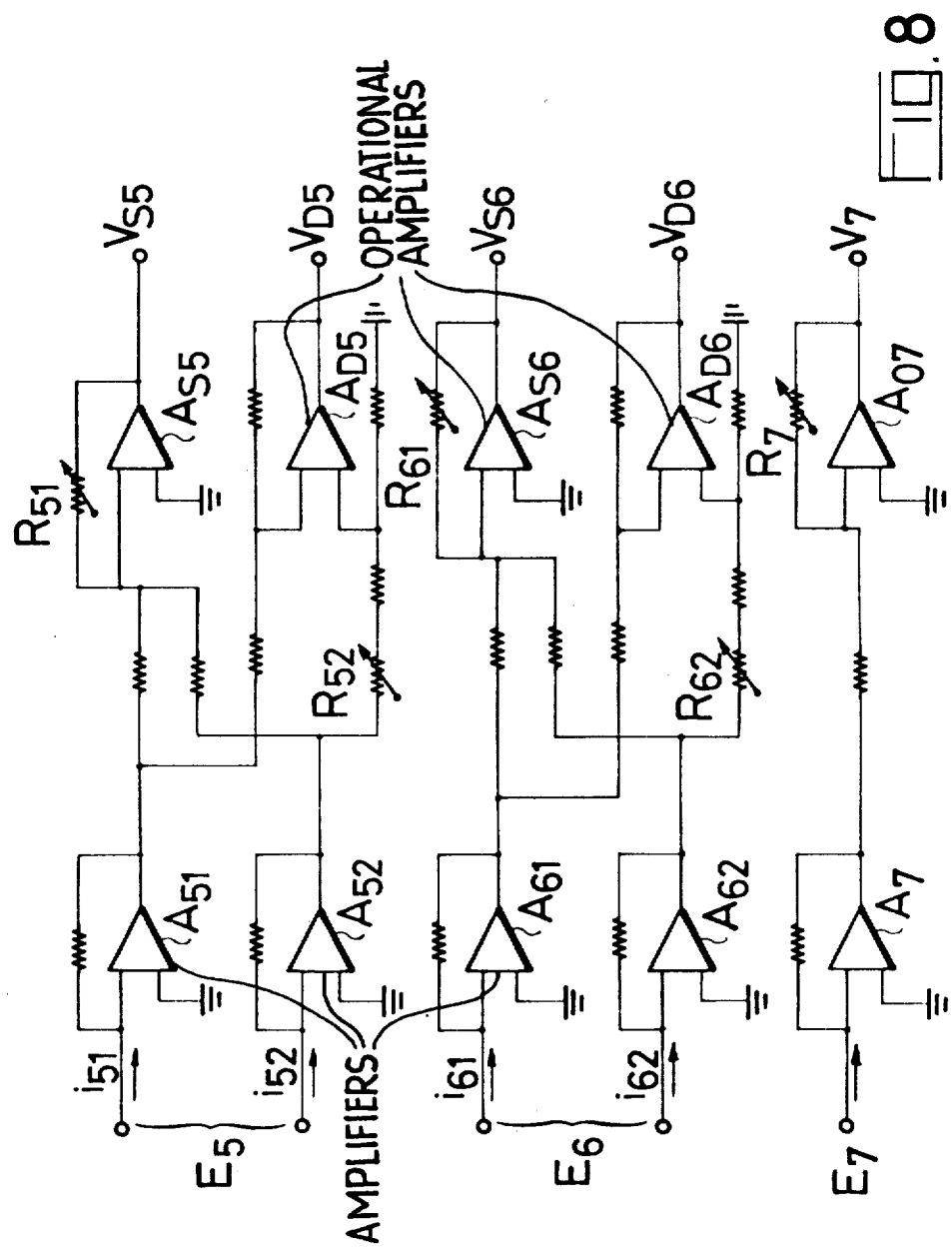
FIG. 8 is a diagram of processing circuitry associated with my improved monitoring device.

FIG. 8 schematically illustrates circuits for processing the signals picked up by the electrodes $E_5$, $E_6$, $E_7$. Amplifiers $A_{51}$, $A_{52}$ produce voltages proportional to the currents $i_{51}$, $i_{52}$. An operational amplifier $A_{S5}$ produces a voltage $V_{S5}$ proportional to the current sum $i_{51} + i_{52}$. A variable resistor $R_{51}$ makes it possible to calibrate the measured value so that this sum represents, on a selected scale, the dose rate measured by the chamber 5.

An operational amplifier $A_{D5}$ furnishes a voltage $V_{D5}$ proportional to the current difference $i_{51} - i_{52}$. A variable resistor $R_{52}$ makes it possible to compensate any slight dissymmetry which might exist between the two elements $e_{51}$ and $e_{52}$ of the electrode $E_5$. Similar elements and voltages have been indicated by corresponding references $A_{61}$, $A_{62}$, $A_{S6}$, $A_{D6}$, $R_{62}$, $V_{S6}$, $V_{D6}$ in the processing circuit for the currents $i_{61}$, $i_{62}$ of electrode $E_6$. An amplifier $A_{O7}$ produces a voltage $V_7$ proportional to the current $i_7$ picked up by electrode $E_7$, and therefore to the dose rate.

Figure 9:
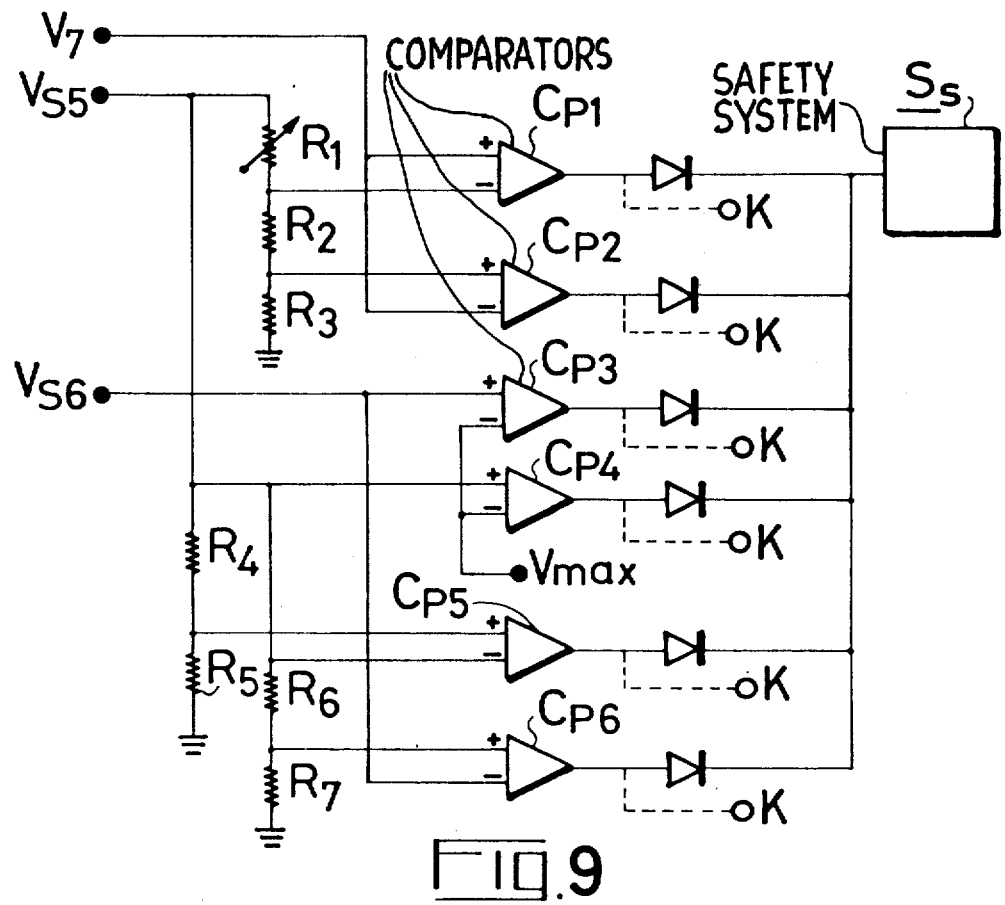
FIG. 9 is a circuit diagram of a comparison network connected to the processor of FIG. 8.

The voltages $V_{S5}$, $V_{S6}$ and $V_7$ are applied respectively to error-detection circuits comprising comparators $C_{P1}$, $C_{P2}$, $C_{P3}$, $C_{P4}$, $C_{P5}$, $C_{P6}$ shown in FIG. 9. Voltage dividers formed by resistors $R_1$ to $R_7$ make it possible to adjust the values of the signals applied to the comparators, for the purpose of compensating mechanical inaccuracies in manufacture.

Since the area of the electrode $E_5$ is larger than that of the electrode $E_7$, the voltage $V_{S5}$ is higher than the voltage $V_{S7}$ in a ratio $S_7/S_5$, namely the ratio of the areas $S_7$ and $S_5$ of the electrodes $E_7$ and $E_5$. The resistors $R_1$, $R_2$ and $R_3$ have resistances such that the voltage $V_7$ satisfies the double inequality:

$$\frac{R_3}{R_1 + R_2 + R_3} V_{S5} < V_7 < \frac{R_2 + R_3}{R_1 + R_2 + R_3} V_{S5} \tag{15}$$

If this double inequality is not satisfied, the comparator $C_{P1}$ or $C_{P2}$ (depending upon the imbalance) will produce a positive output voltage, triggering the safety system $S_s$, or an alarm signal K.

The comparators $C_{P3}$ and $C_{P4}$ trigger the system $S_s$ if the dose rate exceeds a given value $V_{max}$, whereas the comparators $C_{P5}$ and $C_{P6}$ trigger the safety system or emit the alarm signal K if there is any disagreement between the volages $V_{S5}$ and $V_{S6}$ and therefore between the dose rates measured by the electrodes $E_5$ and $E_6$.

Figure 10:
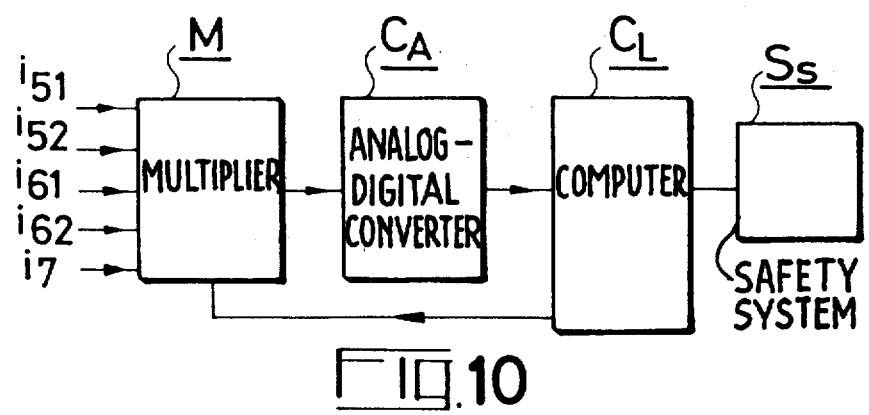
FIG. 10 is a block diagram of an alternate evaluation and control system associated with the device.

In another embodiment, shown in FIG. 10, the currents $i_{51}$, $i_{52}$, $i_{61}$, $i_{62}$, $i_7$ respectively picked up by the elements of the electrodes $E_5$, $E_6$, $E_7$ are applied to a system constituted by a multiplier M and an analog-digital converter $C_A$ working into a computer $C_L$, this system carrying out checks on the aforesaid conditions and controlling the safety system $S_s$ which deactivates the radiation source if these conditions are not met or readjusts the radiation beam in order to obtain the desired characteristics.

What I claim is:

1. In a monitoring system for determining the uniformity of a beam of ionizing radiation and any deviations thereof from a predetermined axis, comprising a radiation detector with a plurality of superposed ionization chambers centered on said axis and separated by radiation-transparent walls, a source of said radiation forming a beam generally centered on said axis, a disk-shaped electrode transverse to said axis in each of said chambers, and circuitry connected to said electrodes for evaluating the relative magnitudes of currents induced by the beam in said electrodes, the improvement wherein said electrodes include a first electrode with a diameter significantly less than that of said beam in one ionization chamber and a second electrode with a diameter substantially equal to that of said beam in another ionization chambers, said circuitry including voltage-comparison means provided with input connections modifying the relative magnitudes of voltages proportional to said induced currents by a factor corresponding to the surface-area ratio of said electrodes whereby said voltages are equal upon full illumination of all said electrodes by a homogenous beam.

2. The improvement defined in claim 1 wherein said input connections include a voltage divider with a step-down ratio corresponding to said surface-area ratio.

3. The improvement defined in claim 1 wherein said ionization chambers are all of the same inner diameter.

4. The improvement defined in claim 1 wherein said first electrode is electrically integral, said second electrode being divided into at least one pair of identical sectors electrically insulated from one another.

5. The improvement defined in claim 4 wherein said second electrode is divided into four quadrantal sectors.

6. The improvement defined in claim 1 wherein said electrodes include a third electrode of the same diameter as said second electrode in a further ionization chamber, at least one electrode other than said first electrode being divided into at least one pair of identical sectors electrically insulated from one another.

7. The improvement defined in claim 6 wherein said second and third electrodes are divided into halves along mutually perpendicular diametral lines.

8. The improvement defined in claim 7 wherein said second and third electrodes are disposed in adjacent ionization chambers.

9. The improvement defined in claim 1 wherein each of said electrodes comprises a sheet of polyethylene terephthalate carrying a radiation-transparent metallic film.

* * * * *